(12) United States Patent  
Kim

(10) Patent No.: US 11,152,537 B2  
(45) Date of Patent: Oct. 19, 2021

(54) LIGHT EMITTING DIODE WITH MULTIPLE TUNNEL JUNCTION STRUCTURE

(71) Applicant: SUNDIODE KOREA, Gwangju (KR)

(72) Inventor: James Chinmo Kim, San Jose, CA (US)

(73) Assignee: SUNDIODE KOREA

( * ) Notice: Subject to any disclaimer, the term of this patent is extended or adjusted under 35 U.S.C. 154(b) by 29 days.

(21) Appl. No.: 16/648,662

(22) PCT Filed: Sep. 4, 2018

(86) PCT No.: PCT/KR2018/010245  
§ 371 (c)(1),  
(2) Date: Mar. 18, 2020

(87) PCT Pub. No.: WO2019/059561  
PCT Pub. Date: Mar. 28, 2019

(65) Prior Publication Data  
US 2020/0287080 A1  Sep. 10, 2020

(30) Foreign Application Priority Data  
Sep. 19, 2017  (KR) ......................... 10-2017-0120141

(51) Int. Cl.  
*H01L 33/06* (2010.01)  
*H01L 33/08* (2010.01)  
*H01L 33/00* (2010.01)

(52) U.S. Cl.  
CPC .......... *H01L 33/06* (2013.01); *H01L 33/0016* (2013.01); *H01L 33/08* (2013.01)

(58) Field of Classification Search  
CPC ...... H01L 33/06; H01L 33/0016; H01L 33/08  
See application file for complete search history.

(56) References Cited

U.S. PATENT DOCUMENTS 9,130,353 B2 * 9/2015 Lell ..................... H01S 5/34313  
9,214,580 B2 * 12/2015 Misra ................ H01L 31/03048  
(Continued)

FOREIGN PATENT DOCUMENTS

KR   20090060358 A   6/2009  
KR   20120040011 A   4/2012  
(Continued)

OTHER PUBLICATIONS

International Search Report for PCT/KR2018/010245 dated Dec. 13, 2018.

*Primary Examiner* — Mark W Tornow  
(74) *Attorney, Agent, or Firm* — Renaissance IP Law Group LLP

(57) ABSTRACT

A light emitting diode having multiple tunnel junctions is provided. This comprises the common contact layer, the first and second tunnel junction layers respectively disposed on the bottom surface and the upper surface of the common contact layer, the first light emitting structure disposed on the bottom surface of the first tunnel junction layer and the second light emitting structure disposed on the upper surface of the second tunnel junction layer. Light emitting structures emitting blue and green light may be disposed above and below the common contact layer. By injecting holes into the first light emitting structure and the second light emitting structure through the common contact layer formed of the n-type semiconductor, current spreading effect is improved, leading to improved light emitting efficiency. Since the n-type semiconductor layer can be disposed on the upper surface exposed to the outside, risk of damage occurring in subsequent fabrication steps can be reduced.

18 Claims, 6 Drawing Sheets

(56) References Cited

U.S. PATENT DOCUMENTS

| | | | |
|---|---|---|---|
| 2006/0097269 A1* | 5/2006 | Lester | H01L 33/08 |
| | | | 257/79 |
| 2007/0158659 A1* | 7/2007 | Bensce | H01L 31/11 |
| | | | 257/79 |
| 2009/0001389 A1 | 1/2009 | Wang et al. | |
| 2010/0224860 A1* | 9/2010 | Ibbetson | H01L 33/04 |
| | | | 257/13 |
| 2011/0073902 A1* | 3/2011 | Strassburg | H01L 33/325 |
| | | | 257/101 |
| 2011/0204376 A1* | 8/2011 | Su | H01L 27/156 |
| | | | 257/76 |
| 2018/0076354 A1* | 3/2018 | Rajan | H01L 33/0016 |
| 2019/0207043 A1* | 7/2019 | Yonkee | H01L 21/02579 |

FOREIGN PATENT DOCUMENTS

| | | |
|---|---|---|
| KR | 20170012146 A | 2/2017 |
| KR | 20170050334 A | 5/2017 |

\* cited by examiner

LIGHT EMITTING DIODE WITH MULTIPLE TUNNEL JUNCTION STRUCTURE

TECHNICAL FIELD

The present disclosure relates to the field of light emitting diodes and more particularly, to a light emitting diode including a multi-tunnel junction structure.

BACKGROUND ART

In general, the basic model of a light emitting diode is to include an active layer interposed between an n-type semiconductor layer and a p-type semiconductor layer. When the active layer has a certain thickness and the compositions of the two semiconductor layers are different, single or multiple quantum well structure is formed in the active layer. When a bias is applied, the n-type semiconductor layer and the p-type semiconductor layer each carry electrons and holes to the active layer and light is emitted as the electrons and holes recombine radiatively in the active layer.

In order for a light emitting diode to be used in an illumination device, it must emit white light similar to natural light. For this purpose, a color conversion element such as a filter or a phosphor is used that converts the emitted color of the light emitting chip to white. For example, a lighting device that emits white light by coupling a yellow phosphor to a light emitting chip made of a nitride semiconductor such as GaN that emits blue light is widely used. The blue light emitting diode chip generates high heat during operation and there is a problem in that the existing phosphors coupled for color conversion are negatively affected by the heat.

DISCLOSURE

Technical Problem

The present inventive concept provides a light emitting diode including multiple tunnel junctions and multiple light emitting structures.

Technical Solution

The present inventive concept provides a light emitting diode, which comprises a common contact layer having a transparent material, a first tunnel junction layer disposed on a lower surface of the common contact layer, a second tunnel junction layer disposed on an upper surface of the common contact layer, a first light emitting structure disposed on a lower surface of the first tunnel junction layer and a second light emitting structure disposed on an upper surface of the second tunnel junction layer.

The first light emitting structure may comprise a first p-type semiconductor layer in contact with the first tunnel junction layer, a first active layer in contact with the first p-type semiconductor layer and a first n-type semiconductor layer in contact with the first active layer.

The first tunnel junction layer may comprise a first highly doped n-type layer in contact with the common contact layer and a first highly doped p-type layer in contact with the first n-type high concentration doping layer.

The upper layers except for the first n-type semiconductor layer may be recessed from a side wall of the first n-type semiconductor layer and a portion of the surface of the first n-type semiconductor layer may be exposed.

The light emitting diode may comprise a metal contact formed on the exposed portion of the first n-type semiconductor layer.

The second light emitting structure may comprise a second p-type semiconductor layer in contact with the second tunnel junction layer, a second active layer in contact with the second p-type semiconductor layer and a second n-type semiconductor layer in contact with the second active layer.

The second tunnel junction layer may comprise a second highly doped n-type layer in contact with the common contact layer and a second highly doped p-type layer in contact with the second highly doped n-type layer.

The upper layers except for the common contact layer may be recessed from a side wall of the common contact layer and a portion of the surface of the common contact layer may be exposed.

The light emitting diode may comprise a metal contact formed on the exposed portion of the common contact layer.

The light emitting diode may further comprise a metal contact formed on an upper surface of the second n-type semiconductor layer.

The common contact layer may be an n-type semiconductor.

The light emitting diode may further comprise a third light emitting structure disposed on an upper surface of the second light emitting structure.

The third light emitting structure may comprise a third active layer in contact with the second n-type semiconductor layer and a third p-type semiconductor layer in contact with the third active layer.

The light emitting diode may further comprise a third tunnel junction layer in contact with the third p-type semiconductor layer and a third n-type semiconductor layer in contact with the third tunnel junction layer.

The third tunnel junction layer may comprise a third highly doped n-type layer in contact with the third n-type semiconductor layer and a third highly doped p-type layer in contact with the third highly concentration doped n-type layer.

The upper layers except for the second n-type semiconductor layer may be recessed from a side wall of the second n-type semiconductor layer and a portion of the surface of the second n-type semiconductor layer may be exposed.

The light emitting diode may comprise a metal contact formed in an exposed portion of the second n-type semiconductor layer.

The light emitting diode may further comprise a metal contact formed on an upper surface of the third n-type semiconductor layer.

Advantageous Effects

According to the present inventive concept, a light emitting diode having multiple tunnel junctions is provided. Such multiple tunnel junctions allow configuring multiple light emitting structures. For example, in the light emitting diode of the present inventive concept, the first light emitting structure may be configured as a blue light emitting device and the second light emitting structure may be configured as a green light emitting device and a white light emitting diode may be implemented by applying a red color conversion element or a separate light emitting structure. For example, when two or more common contact layers having tunnel junction layers are disposed on upper and bottom surfaces and three or more light emitting structures are disposed, a white light emitting diode may be implemented. In addition, the light emitting diode having the multiple tunnel junctions of the present inventive concept can be preferably applied to the microLED field. Application of the n-type semiconductor to the common contact layer enhances current spreading and improves light emitting efficiency. Furthermore, since the semiconductor layer exposed to the uppermost surface can be applied as an n-type semiconductor, damage due to the subsequent fabrication steps, which is common in a p-type semiconductor, can be suppressed.

MODES OF THE INVENTION

Figure 1:
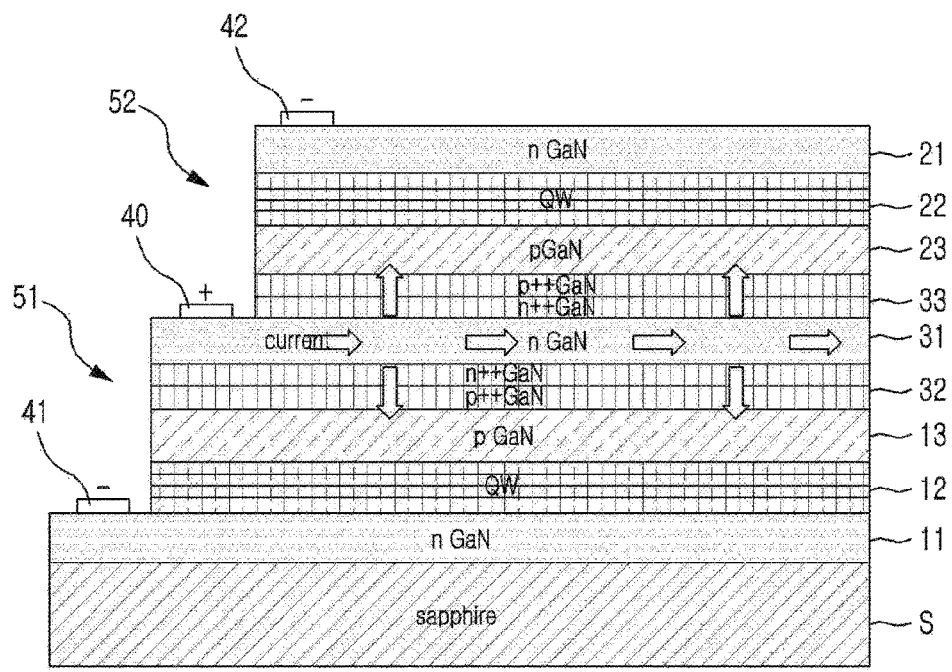
FIG. 1 Is a view schematically illustrating a light emitting diode according to a preferred embodiment of the present inventive concept.

Hereinafter, embodiments of the present inventive concept will be described in detail with reference to the accompanying drawings. In describing the embodiments of the present inventive concept, if it is determined that a detailed description of related known functions or configurations may unnecessarily obscure the subject matter of the present inventive concept, the detailed description thereof will be omitted.

Briefly described, the present inventive concept is related to a light emitting diode including multiple light emitting structures and multiple tunnel junctions. A preferred embodiment of the present inventive concept provides a structure in which two light emitting structures are disposed above and below a common contact layer. The common contact layer may be formed of, for example, an n-type semiconductor layer and the first tunnel junction layer and the second tunnel junction layer are disposed on the bottom surface and the upper surface of the common contact layer, respectively. The first light emitting structure is disposed to be in contact with the bottom surface of the first tunnel junction layer and the second light emitting structure is disposed to be in contact with the upper surface of the second tunnel junction layer. Specifically, each of the first light emitting structure and the second light emitting structure is disposed such that the p-type semiconductor layer contacts the tunnel junction layer and holes are injected into the active layers of the first and second light emitting structures through the common contact layer. Current spreading may be obtained by the introduction of the n-type semiconductor into a common contact layer that is between multiple light emitting structures of the present inventive concept. The enhanced current spreading may solve the problem of current flowing only in a portion close to a positive metal contact on the common contact layer and therefore partially emitting light, when the common contact layer is a p-type semiconductor. In addition, by suppressing exposure of the p-type semiconductor layer, the occurrence of damage is relatively reduced in subsequent fabrication processes. In addition, the multiple light emitting diodes of the present inventive concept can constitute various light emission color combinations, such as blue and green, thus expanding choices of applicable phosphors.

For reference, with respect to the metal contacts in the following, a positive metal contact or a negative metal contact is used to distinguish and refer to the metal contacts that are respectively formed and does not limit the type of metal applied.

In the following, sapphire, SiC, ZnO, GaN, AlN, etc. may be used as a substrate (denoted by S in FIGS. 1 to 10) the light emitting diode of the present inventive concept. In addition, the n-type semiconductor layer may be selected from a semiconductor material having a composition formula of $In_xAl_yGa_{1-x-y}N$ ($0 \leq x \leq 1$, $0 \leq y \leq 1$, $0 \leq x+y \leq 1$) which, for example, may be one of GaN, AlN, AlGaN, InGaN, InN, InAlGaN and AlInN and may be doped with an n-type dopant such as Si, Ge, Sn, or the like. The p-type semiconductor layer may be selected from a semiconductor material having a composition formula of $In_xAl_yGa_{1-x-y}N$ ($0 \leq x \leq 1$, $0 \leq y \leq 1$, $0 \leq x+y \leq 1$) which, for example, may be one of GaN, AlN, AlGaN, InGaN, InN, InAlGaN, AlInN and may be doped with a p-type dopant such as Mg, Zn, Ca, Sr, Ba, or the like. The active layer may be formed of a semiconductor material having a composition formula of $In_xAl_yGa_{1-x-y}N$ ($0 \leq x \leq 1$, $0 \leq y \leq 1$, $0 \leq x+y \leq 1$) and may be a single quantum well structure or a multi-quantum well (MQW) structure. The tunnel junction layer may be formed such that the n-type dopant and the p-type dopant are included in relatively high concentrations.

FIG. 1 is a schematic cross-sectional view of a light emitting diode according to a preferred embodiment of the present inventive concept.

Referring to FIG. 1, a light emitting diode according to a preferred embodiment of the present inventive concept includes a first light emitting structure and a second light emitting structure respectively disposed below and above the common contact layer 31. First and second tunnel junction layers 32 and 33 are disposed between the common contact layer 31 and the first light emitting structure and between the common contact layer 31 and the second light emitting structure, respectively. For example, the first light emitting structure and the second light emitting structure may emit blue and green light, respectively.

The common contact layer 31 may be an n-type semiconductor, for example, n-GaN, but is not limited thereto. In particular, the common contact layer has a transparent material and can be selected if the material can ensure a high conductivity. However, when a person skilled in the art intends to reproduce the present inventive concept, it is necessary to take into consideration the material of the tunnel junction layer formed on the common contact layer. Factors to be considered include the material for the common contact layer and the work function of the tunnel junction layer.

The first tunnel junction layer 32 is disposed on the bottom surface of the common contact layer 31. For example, the first tunnel junction layer 32 may have a structure in which an $n^{++}$-GaN layer and a $p^{++}$-GaN layer are sequentially stacked in a downward direction from the common contact layer 31. Due to the stacked structure in the above order, current spreading may also occur in the first tunnel junction layer 32. That is, the first tunnel junction layer has a structure in which two heavily doped semiconductor layers are stacked. In this embodiment, the layer named $n^{++}$-GaN layer is only an example of the first highly doped n-type layer. In addition, the layer named $p^{++}$-GaN layer means the first highly doped p-type layer. In addition, in the present embodiment, doping at high concentration means introducing dopants into a specific semiconductor layer with concentrations that exceed the dopant concentrations for forming a conventional n-type semiconductor layer.

The first light emitting structure is disposed below the first tunnel junction layer 32. The first light emitting structure includes the first p-type semiconductor layer 13, the first active layer 12 and the first n-type semiconductor layer 11 sequentially disposed downward from the first tunnel junction layer 32.

The second tunnel junction layer 33 is disposed on the upper surface of the common contact layer 31. For example, the second tunnel junction layer 33 may have a structure in which an $n^{++}$-GaN layer and a $p^{++}$-GaN layer are sequentially stacked in the upward direction from the common contact layer 31. Due to the stacked structure in the above order, current spreading may also occur in the second tunnel junction layer 33, as in the first tunnel junction layer 32.

The second light emitting structure is disposed on the second tunnel junction layer 33. The second light emitting structure includes the second p-type semiconductor layer 23, the second active layer 22 and the second n-type semiconductor layer 21 sequentially disposed upward from the second tunnel junction layer 33.

The light emitting diode may include a first mesa structure 51 in which upper layers of the first n-type semiconductor layer 11 are removed to expose a portion of the upper surface of the first n-type semiconductor layer 11. In the first mesa structure 51, upper layers except for the first n-type semiconductor layer 11 may be recessed from a side wall of the first n-type semiconductor layer 11 and a portion of the surface of the first n-type semiconductor layer may 11 be exposed. For example, the first negative metal contact 41 may be disposed on an upper surface of the first n-type semiconductor layer 11 exposed by the etched portion of the first mesa structure 51.

The light emitting diode of the present inventive concept may include a second mesa structure 52 for exposing a part of the upper surface of the common contact layer 31. In the second mesa structure 52, upper layers except for the common contact layer 31 may be recessed from a side wall of the common contact layer 31 and a portion of the surface of the common contact layer 31 be exposed. For example, the positive metal contact 40 may be disposed on an upper surface of the common contact layer 31 exposed by the etched portion of the second mesa structure 52.

For reference, for the exposed portions of the common contact layer 31 and the first n-type semiconductor layer 11 in the mesa etching structures described above, unlike in the illustrated example, the upper surface portions of the common contact layer 31 and the first n-type semiconductor layer may be etched a little deeper.

In addition, the light emitting diode may include a second negative metal contact 42 disposed on an upper surface of the second n-type semiconductor layer 21.

Multiple quantum well structures may be disposed in the first active layer 12 and the second active layer 22.

When a current is applied through the positive metal contact 40 connected to the common contact layer 31 and the first and second negative metal contacts 41 and 42 connected to the first and second n-type semiconductor layers 11 and 21, respectively, holes are injected through the common contact layer 31 and electrons are injected through the first and second n-type semiconductor layers 11 and 21. The holes and electrons thus injected are combined radiatively in the first and second active layers 12 and 22 to emit light from the first and second light emitting structures, respectively.

As described above, since the first and second tunnel junction layers 32 and 33 are disposed on the bottom surface and the upper surface of the common contact layer 31 formed of an n-type semiconductor such as n-GaN, respectively, holes may be injected into the first active layer 12 and the second active layer 22 through the common contact layer 31, thereby realizing a light emitting diode in which two light emitting structures are stacked. In addition, since the light emitting diode structure of the present inventive concept can form the common contact layer 31 for injecting holes with an n-type semiconductor, compared with forming a conventional hole injection layer using a p-type semiconductor, current spreading in the common contact layer 31 is well performed, resulting in good light emitting efficiency for the light emitting diode.

In addition, in the light emitting diode of the present inventive concept, the semiconductor layer disposed as the uppermost layer may be an n-type semiconductor layer. In this structure, compared with the conventional light emitting diode structure in which the p-type semiconductor layer is disposed and exposed at the upper layer, damage to the semiconductor layer, which may occur during fabrication processes performed after stacking of the entire structure is completed, can also be suppressed. In addition, since all metal contacts 40, 41 and 42 are formed on the n-type semiconductor layer, the adhesion of the metal is relatively good.

In the light emitting diode of the present inventive concept in which two light emitting structures are stacked as described above, the first light emitting structure may emit blue light and the second light emitting structure may emit green light. In this case, white light emission can be realized simply by applying a red color conversion element. Therefore, in the diode of the present inventive concept, Ce3+: YAG (cerium-doped yttrium aluminum garnet) which causes a discoloration problem for GaN-based blue light emitting devices does not need to be employed.

The light emitting device according to the preferred embodiment of the present inventive concept described above may be manufactured through the following processes.

FIGS. 2 to 8 are diagrams for explaining a manufacturing process of the LED of the present inventive concept.

Figure 2:
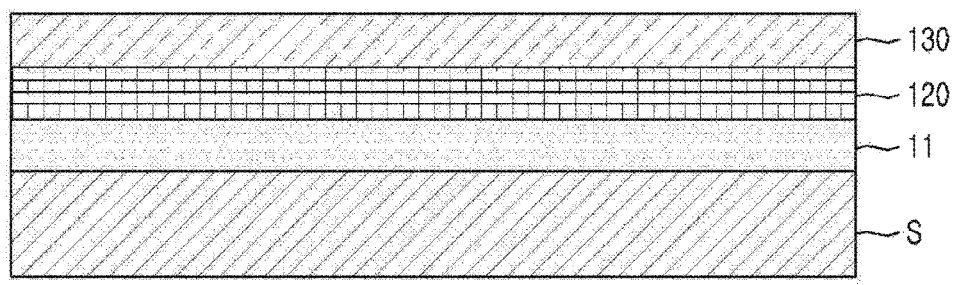
FIGS. 2 to 9 are views illustrating a process of manufacturing the light emitting diode of FIG. 1.

As shown in FIG. 2, the first light emitting structure is formed on a substrate S such as, for example, sapphire. This may be implemented by sequentially stacking the first n-type semiconductor layer 11, the layer 120 for the first active layer and the layers 130 for the first p-type semiconductor layer on the substrate s. Here, the first n-type semiconductor layer 11 may be, for example, n-GaN and the layer 130 for the first p-type semiconductor layer may be p-GaN.

Figure 3:
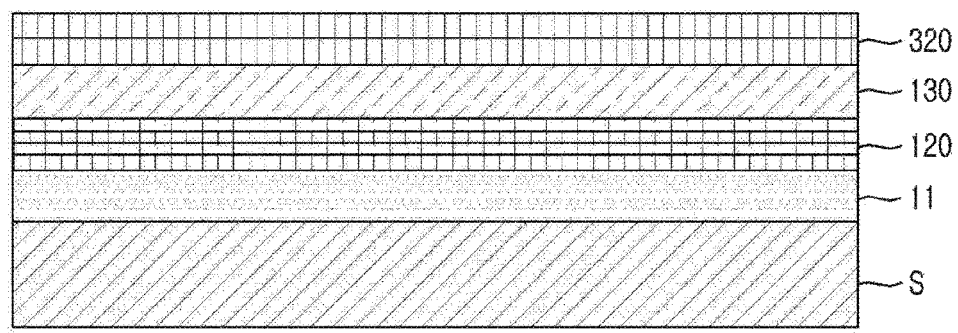

As shown in FIG. 3, a layer 320 for the first tunnel junction layer is formed on the first p-type semiconductor layer 130 having the structure formed in FIG. 2. This may be a structure in which $n^{++}$-GaN layer is stacked on $p^{++}$-GaN layer in an upward direction on the layer 130 for the first p-type confinement layer.

Figure 4:
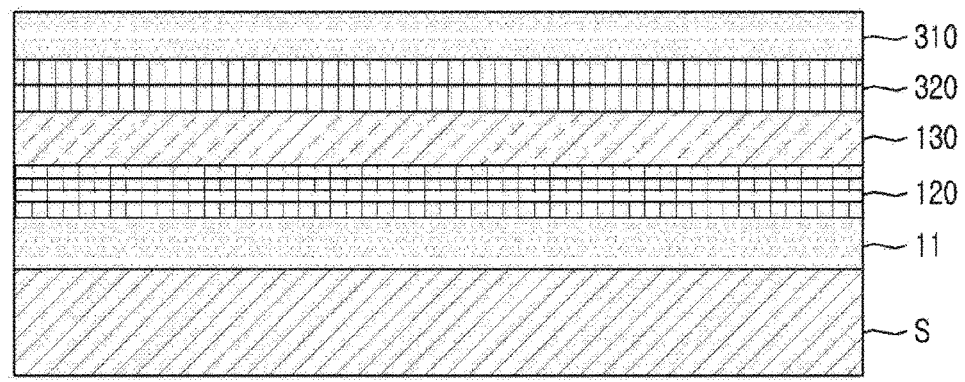

As shown in FIG. 4, a layer 310 for the common contact layer is formed with n-GaN on the layer 320 for the first tunnel junction layer.

Figure 5:
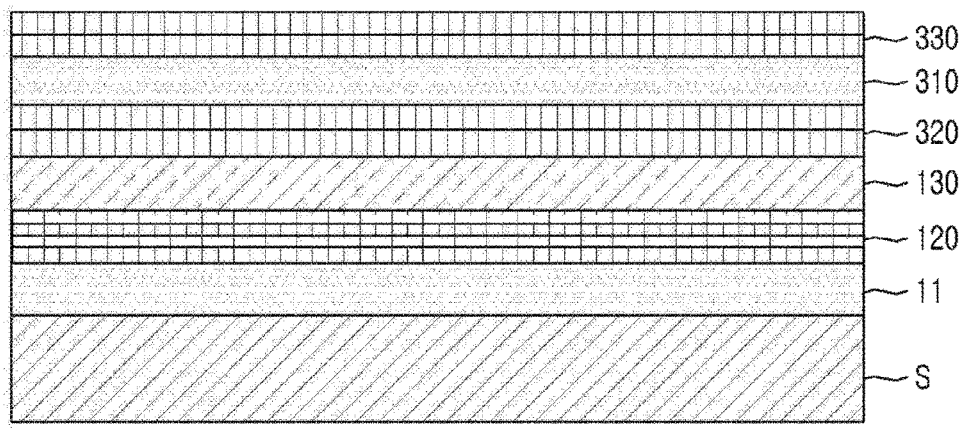

Next, as shown in FIG. 5, the layer 330 for the second tunnel junction layer is formed on the layer 310 for the common contact layer. For example, a structure in which $p^{++}$-GaN layer is stacked on $n^{++}$-GaN layer in an upward direction on the layer 310 for the common contact layer, may be applied.

Figure 6:
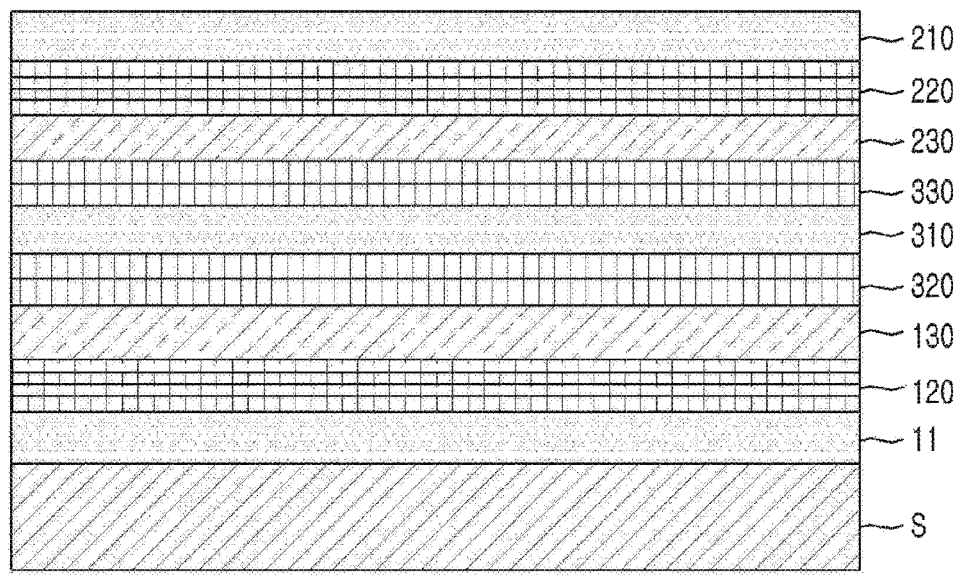

As shown in FIG. 6, a stacked structure for the second light emitting structure is formed on the layer 330 for the second tunnel junction. For example, on the layer 330 for the second tunnel junction layer, a layer 230 for the second p-type semiconductor layer, a layer 220 for the second active layer and a layer 210 for the second n-type semiconductor layer are formed sequentially. The layer 230 for the second p-type semiconductor layer and the layer 210 for the second n-type semiconductor layer are formed of p-GaN and n-GaN, respectively.

Figure 7:
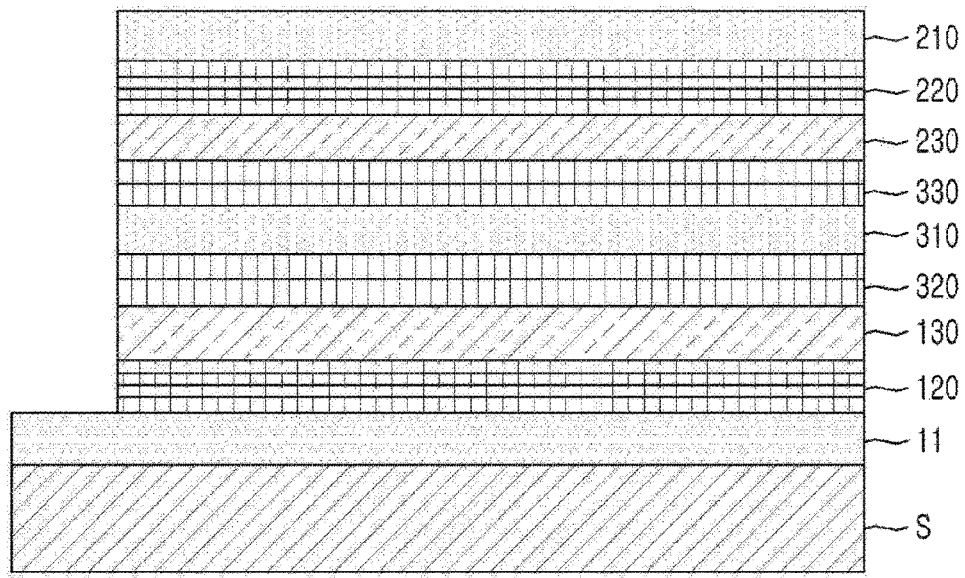

Next, as shown in FIG. 7, the first mesa structure 51 is formed. The first mesa structure may be formed by removing a portion of the upper layers to expose a portion of the upper surface of the first n-type confinement layer 11. By forming the first mesa structure 51, a structure for the first light emitting structure shown in FIG. 9 is completed, consisting of the first n-type semiconductor layer 11, the first active layer 12, the first p-type semiconductor layer 13, the first tunnel junction layer 32 and the common contact layer 31.

Figure 8:
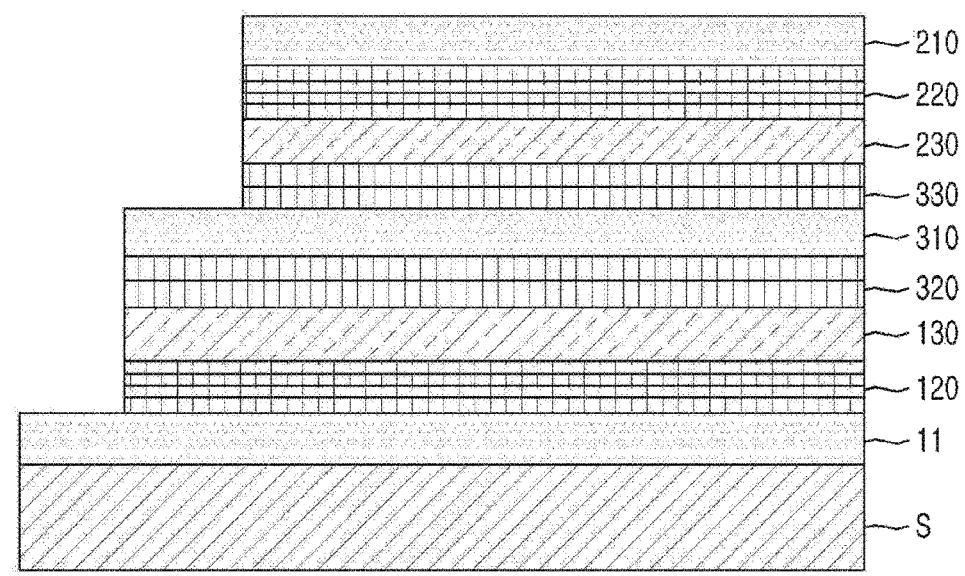

As shown in FIG. 8, the second mesa structure 52 is formed to expose a portion of the upper surface of the common contact layer 310. The second mesa structure 52 may be formed by partially removing the layer 330 for the second tunnel junction layer on the common contact layer, the layer 230 for the second p-type semiconductor layer, the layer 220 for the second active layer and the layer 210 for the second n-type semiconductor layer. By forming the second mesa structure 52, a structure for the second light emitting structure shown in FIG. 9 is completed, consisting of the second n-type semiconductor layer 21, the second active layer 22, the second p-type semiconductor layer 23 and the second tunnel junction layer 33.

Figure 9:
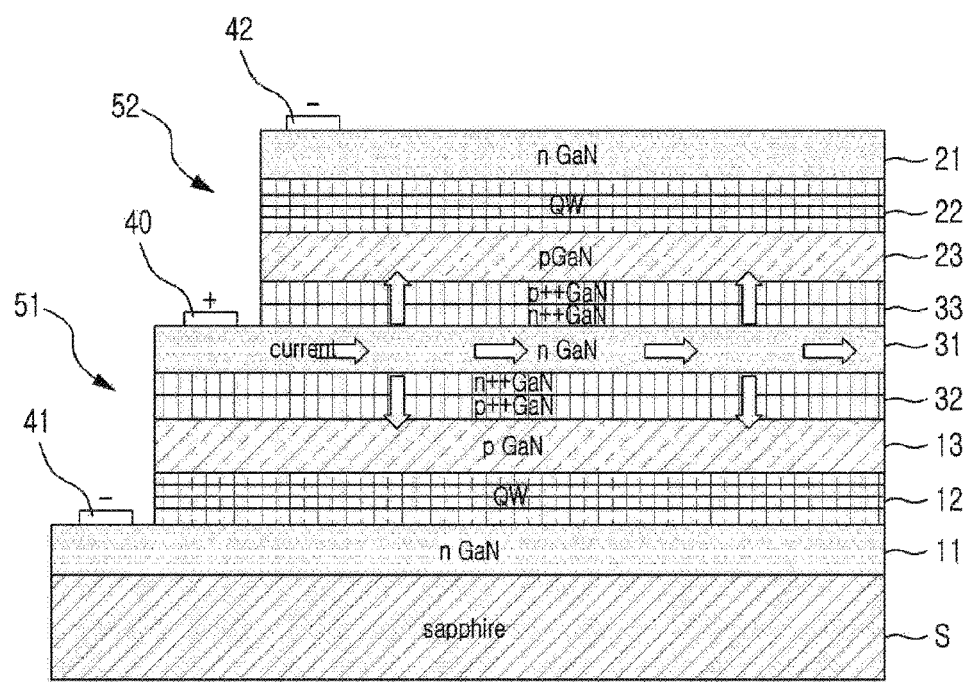

As shown in FIG. 9, the positive metal contact 40, the first negative metal contact 41 and a second negative metal contact 42 are respectively disposed on the common contact layer 31, the first n-type semiconductor layer 11 and the second n-type semiconductor layer 21 with exposed upper surfaces.

Figure 10:
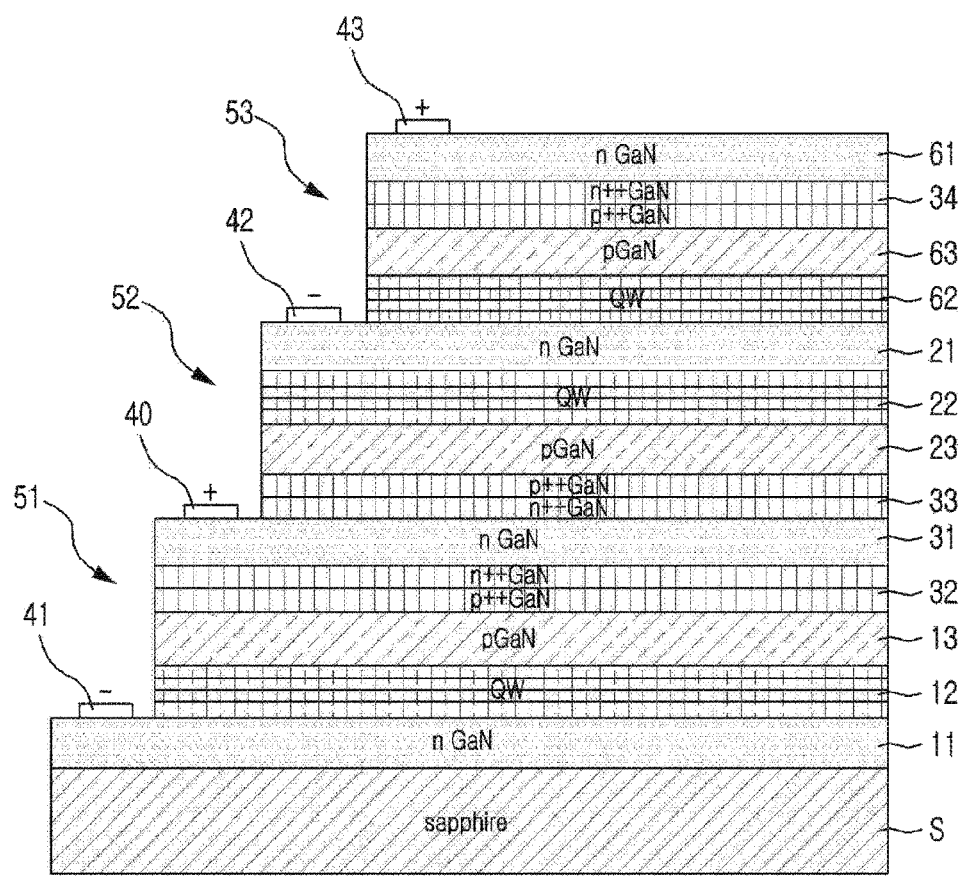
FIG. 10 is a view schematically illustrating a light emitting diode according to another embodiment of the present inventive concept.

FIG. 10 is a schematic cross-sectional view of a light emitting diode according to another embodiment of the present inventive concept.

Another embodiment shown in FIG. 10 shows a configuration including three or more active layers 12, 22, 62. In the example of FIG. 10, the second n-type semiconductor layer 21 disposed on the bottom surface of the third active layer 62 is used in common as the uppermost layer of the light emitting diode of FIG. 1. A third active layer 62 is formed thereon and a third p-type semiconductor layer 63 is disposed on the third active layer 62. The third tunnel junction layer 34 may be disposed on the third p-type semiconductor layer 63 and the third n-type semiconductor layer 61 may be disposed thereon. In this way, a plurality of light emitting structures can be contiguously stacked in the upward direction. In the light emitting diode of FIG. 10, the mesa structure 53 and the positive contact 43 may be disposed and such a configuration may be implemented as a white light emitting diode. For reference, the third tunnel junction layer 34 and the third n-type semiconductor layer 61 may be removed in the structure of FIG. 10.

Each of the light emitting structures in the light emitting diode of the present inventive concept shown in the examples shown in FIGS. 2 to 10 can be driven individually and in this case, the light emitting diode can be made to emit a desired color.

In the foregoing detailed description of the present inventive concept, specific embodiments have been described. However, it will be apparent to those skilled in the art that various modifications can be made without departing from the scope of the present inventive concept.

The invention claimed is:

1. A light emitting diode comprising:
    a common contact layer having a transparent material;
    a first tunnel junction layer disposed on a bottom surface of the common contact layer;
    a second tunnel junction layer disposed on an upper surface of the common contact layer;
    a first light emitting structure disposed on a bottom surface of the first tunnel junction layer; and
    a second light emitting structure disposed on the upper surface of the second tunnel junction layer.

2. The light emitting diode of claim 1, wherein the first light emitting structure comprises:
    a first p-type semiconductor layer in contact with the first tunnel junction layer;
    a first active layer in contact with the first p-type semiconductor layer; and
    a first n-type semiconductor layer in contact with the first active layer.

3. The light emitting diode of claim 2, wherein the first tunnel junction layer comprises:
    a first n-type high concentration doping layer in contact with the common contact layer; and
    a first p-type high concentration doping layer in contact with the first n-type high concentration doping layer.

4. The light emitting diode of claim 3, wherein upper layers except for the first n-type semiconductor layer are recessed from a side wall of the first n-type semiconductor layer and a portion of the surface of the first n-type semiconductor layer is exposed.

5. The light emitting diode of claim 4, further comprising a metal contact formed in an exposed portion of the first n-type semiconductor layer.

6. The light emitting diode of claim 1, wherein the second light emitting structure comprises:
    a second p-type semiconductor layer in contact with the second tunnel junction layer;
    a second active layer in contact with the second p-type semiconductor layer; and
    a second n-type semiconductor layer in contact with the second active layer.

7. The light emitting diode of claim 2, wherein the second tunnel junction layer comprises:
    a second n-type high concentration doping layer in contact with the common contact layer; and
    a second p-type high concentration doping layer in contact with the second n-type high concentration doping layer.

8. The light emitting diode of claim 7, wherein upper layers except for the common contact layer are recessed from a side wall of the common contact layer and a portion of the surface of the common contact layer is exposed.

9. The light emitting diode of claim 8, comprising a metal contact formed in the exposed portion of the common contact layer.

10. The light emitting diode of claim 9, further comprising a metal contact formed on an upper surface of the second n-type semiconductor layer.

11. The light emitting diode of claim 1, wherein the common contact layer is an n-type semiconductor.

12. The light emitting diode of claim 1, further comprising a third light emitting structure disposed on an upper surface of the second light emitting structure.

13. The light emitting diode of claim 12, wherein the third light emitting structure comprises:
    a third active layer in contact with the second n-type semiconductor layer; and
    a third p-type semiconductor layer in contact with the third active layer.

14. The light emitting diode of claim 13, further comprising:
- a third tunnel junction layer in contact with the third p-type semiconductor layer; and
- a third n-type semiconductor layer in contact with the third tunnel junction layer.

15. The light emitting diode of claim 14 wherein the third tunnel junction layer comprises:
- a third n-type high concentration doping layer in contact with the third n-type semiconductor layer; and
- a third p-type high concentration doping layer in contact with the third n-type high concentration doping layer.

16. The light emitting diode of claim 15, wherein upper layers except for the second n-type semiconductor layer are recessed from a side wall of the second n-type semiconductor layer and a portion of the surface of the second n-type semiconductor layer is exposed.

17. The light emitting diode of claim 16, comprising a metal contact formed in the exposed portion of the second n-type semiconductor layer.

18. The light emitting diode of claim 17, further comprising a metal contact formed on an upper surface of the third n-type semiconductor layer.

\* \* \* \* \*